United States Patent [19]

Sano

[11] Patent Number: 5,729,040
[45] Date of Patent: Mar. 17, 1998

[54] SEMICONDUCTOR DEVICE HAVING GROUPS OF ELEMENT REGIONS IN THE SEMICONDUCTOR SUBSTRATE

[75] Inventor: Yoshiyuki Sano, Yokohama, Japan

[73] Assignee: Kabushiki Kaisha Toshiba, Kawasaki, Japan

[21] Appl. No.: 704,081

[22] Filed: Aug. 28, 1996

[30] Foreign Application Priority Data

Sep. 1, 1995 [JP] Japan ................... 7-248420

[51] Int. Cl.$^6$ ................................. H01L 29/00
[52] U.S. Cl. ................ 257/504; 257/355; 257/494; 257/544
[58] Field of Search ..................... 257/355, 494, 257/504, 544

[56] References Cited

U.S. PATENT DOCUMENTS 5,608,253  3/1997  Liu et al. ................... 257/365

*Primary Examiner*—Edward Wojciechowicz
*Attorney, Agent, or Firm*—Finnegan, Henderson, Farabow, Garrett & Dunner, L.L.P.

[57] ABSTRACT

A semiconductor device having the grounds of element regions are provided in a semiconductor substrate. The device comprises a semiconductor substrate of a first conductivity type, at least two element regions of a second conductivity type, provided in a semiconductor substrate and having grounds connected to said semiconductor substrate when said semiconductor substrate is set at a fixed potential and at least one ground-isolating well region of the second conductivity type, provided between said at least two element regions to electrically isolate said at least two element regions by forming a depletion layer between said at least two element regions when applied with a reverse bias voltage.

6 Claims, 5 Drawing Sheets

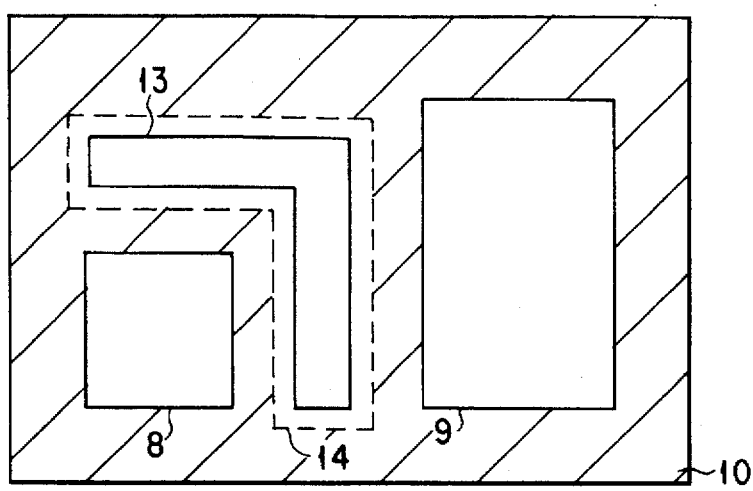
F I G. 11
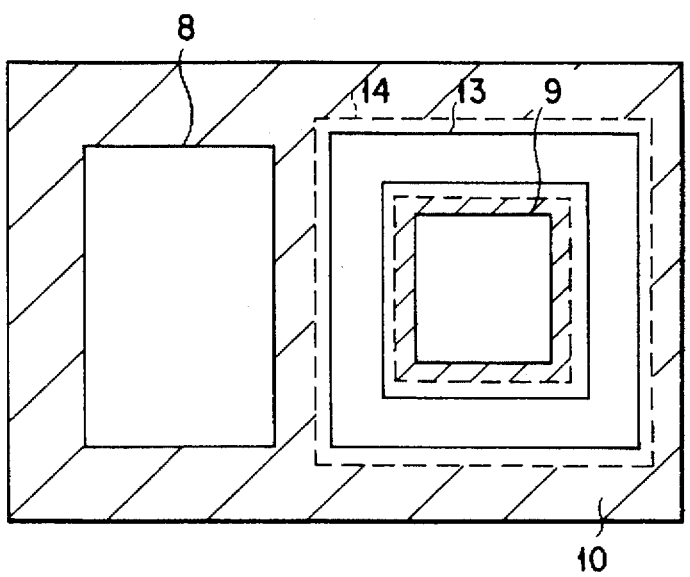
F I G. 12

SEMICONDUCTOR DEVICE HAVING GROUPS OF ELEMENT REGIONS IN THE SEMICONDUCTOR SUBSTRATE

BACKGROUND OF THE INVENTION

1. Field of the Invention

The present invention relates to a semiconductor device in which the grounds of the adjacent element regions are provided in the semiconductor substrate and electrically isolated from one another, and which therefore operates with high reliability.

2. Description of the Related Art

In recent years, the operating speed of semiconductor devices such as ICs and LSIs has increased and the elements incorporated in each device have been made smaller. Since the elements are arranged in a limited space, a parasitic capacitance will increase unless the ground of each element region is isolated from the ground of any other element region.

In a drive circuit or the like made of semiconductor components, it is necessary in some case to electrically isolate the output circuit from the control circuit in order to transfer signals. The output circuit comprises a power portion having power elements or a power circuit. The control circuit for controlling the output circuit comprises a small-signal portion. Both the small-signal portion and the power portion are grounded. They are interfered with each other's voltage change and may malfunction. The ground of the small-signal portion (hereinafter referred to as "S-GND") and the ground of the power portion (herein-after referred to as "P-GND") therefore need to be electrically insulated or isolated from each other. One method of isolating S-GND and P-GND is to use a photocoupler.

FIG. 1 is a block diagram of a conventional drive circuit which has a photocoupler. As FIG. 1 shows, the drive circuit comprises a small-signal portion S, a power portion P and a photocoupler 6.

The small-signal portion S comprises a control power supply (VDL) 3 and a control circuit 5. The power supply 3 and the control circuit 5 are connected to the S-GND 1. The power portion P comprises a switch driving circuit 7 and a switching transistor Tr (i.e., a bipolar transistor) driven by the circuit 7. The circuit 7 and the transistor Tr are connected to the ground P-GND 2.

The photocoupler 6 is composed of a light-emitting diode and a phototransistor. The photocoupler 6 transfers an output signal of the control circuit 5 to the switch driving circuit 7.

The photocoupler 6 connects the control circuit 5 to the switch driving circuit 7. Hence, the S-GND 1 and the P-GND 2 are electrically isolated. Therefore, they are free of each other's interference.

FIG. 2 shows another conventional semiconductor device which comprises a P-type semiconductor substrate 10 and N wells 21 and 22 provided in the surface of the substrate 10. The N wells 21 and 22 are element regions, constituting a semiconductor element or a part of an integrated circuit such as a memory or a logic circuit. When a voltage is externally applied across that portion of the substrate 10 which lies between the N wells 21 and 22, a parasitic NPN transistor 23 is formed in the P-type semiconductor substrate 10. Because of the parasitic transistor 23, the semiconductor device malfunctions.

To prevent the parasitic NPN transistor 23 from operating and, ultimately, the operating errors of the semiconductor device, a dummy N well 24 may be provided in the surface of the substrate 10 and between the N wells 21 and 22 as illustrated in FIG. 3. The dummy N well 24 prevents the parasitic NPN transistor from operating. This is because the dummy N well 24 takes the position of the base region of the parasitic NPN transistor 23 which would be formed if the dummy N well 24 were not provided.

It is true that the use of the dummy N well 24 prevents the parasitic NPN transistor 23 from operating. However, there is a resistance between the N wells 21 and 22, which allows a current to flow between the N wells 21 and 22. In other words, the N wells 21 and 22 are not electrically isolated.

If the S-GND 1 and the P-GND 2 are connected to the P-type semiconductor substrate 10, they are connected by the resistance of the substrate 10. The S-GND 1 and the P-GND 2 are inevitably interfered with the variation of each other's voltage.

If only the S-GND 1 is connected to the semiconductor substrate, the S-GND 1 and the P-GND 2 are not interfered with the variation of each other's voltage. In this case, the semiconductor device does not malfunction at all. As long as the semiconductor substrate has a plurality of N wells (i.e., a plurality of element regions), a parasitic transistor exists any two adjacent N wells unless if a dummy N well is provided between the N wells. Consequently, a current flows from the output circuit into the semiconductor substrate, causing the parasitic transistor to operate and the device to malfunction.

SUMMARY OF THE INVENTION

The object of the present invention is to provide a semiconductor device in which the grounds of the adjacent element regions are provided in the semiconductor substrate and electrically isolated from one another, and which therefore operates with high reliability.

To attain the object, the semiconductor device according to the invention comprises: a semiconductor substrate of a first conductivity type; at least two element regions of a second conductivity type, provided in the semiconductor substrate and having grounds connected to the semiconductor substrate when the semiconductor substrate is set at a fixed potential; and at least one ground-isolating well region of the second conductivity type, provided between the at least two element regions to electrically isolate the at least two element regions by forming a depletion layer between the at least two element regions when applied with a reverse bias voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a plan view of a semiconductor device according to the invention, showing a ground-isolating well of another shape, arranged at another portion; and FIG. 12 is a plan view of a semiconductor device according to the invention, showing a ground-isolating well of still another shape, arranged at still another position.

DETAILED DESCRIPTION OF THE PREFERRED EMBODIMENTS

Figure 1:
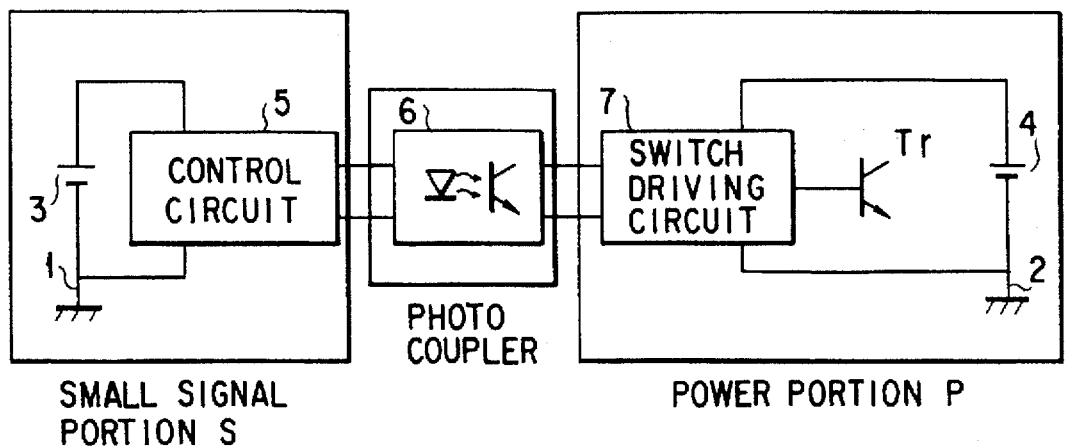
FIG. 1 is a schematic circuit diagram of a conventional semiconductor device.

Embodiments of the invention will be described, with reference to the accompanying drawings.

FIGS. 4 to 7 show a semiconductor device according to the first embodiment of the present invention. As seen from FIGS. 4 and 5 which are a sectional view and a plan view, respectively, the device comprises a P-type semiconductor substrate 10, a first N well 8 and a second N well 9. Both N well 8 and 9 are provided in one major surface of the substrate 10. The first N well 8 is a part of a small-signal portion, and the second N well 9 is a part of a power portion.

The major surface of the semiconductor substrate 10 is covered with an insulating film 20 of, for example, $SiO_2$. The N wells 8 and 9 have been formed by known semiconductor-manufacturing technique such as impurity diffusion or ion implantation.

Figure 4:
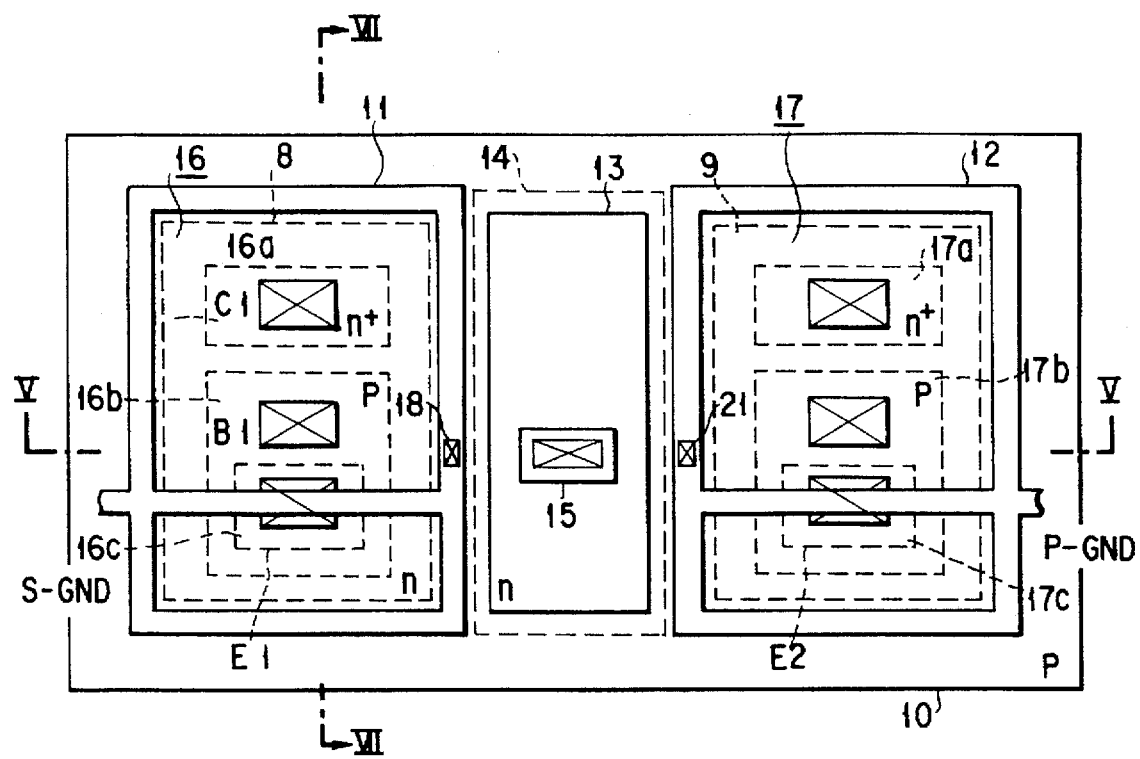
FIG. 4 is a plan view of a semiconductor device according to a first embodiment of this invention.

In the first N well 8, a control circuit (not shown) having a bipolar transistor is provided. In the second N well 9, there are provided a switching element and a circuit (not shown) for driving the switching element. The switching elements are bipolar transistors. In FIG. 4, no components provided in the first N well 8, but bipolar transistor 16, are shown, and no components provided in the second N well 9, but bipolar transistor 17, are shown.

As indicated above, the first N well 8 and the second N well 9 are provided in the major surface of the semiconductor substrate 10. Also provided in the major surface is an N well 13 for isolating grounds. The N well 13 is located between the first N well 8 and the second N well 9.

The bipolar transistor 16 provided in the first N well 8 constitutes a part of the control circuit which is an integrated circuit. As shown in FIG. 4, the bipolar transistor 16 comprises an $N^+$-type collector region 16a, a P-type base region 16b and an $N^+$-type emitter region 16c. The emitter region 16c is provided in the base region 16b. A collector electrode C1 is provided on the collector region 16a, a base electrode B1 on the base region 16b, and an emitter electrode E1 on the emitter region 16c.

As seen from FIG. 4, a first wire 11 is provided on the insulating film 20, surrounding the first N well 8. The first wire 11 has a part extending across the first N well 8. This part of the first wire 11 is electrically connected to the emitter electrode E1 of the bipolar transistor 16.

Figure 5:
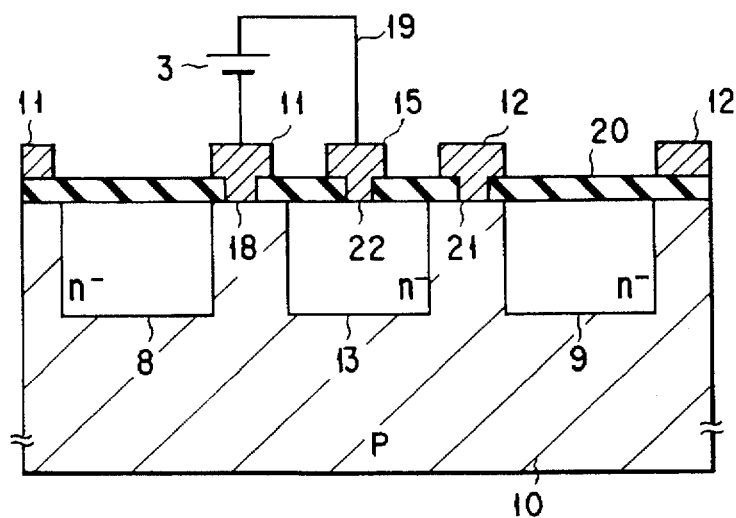
FIG. 5 is a reduced sectional view of the device, taken along line V—V in FIG. 4.

The insulating film 20 has an opening 18 near the N well 13 which is provided for isolating grounds. A part of the first wire 11 is provided in the opening 18 and is therefore electrically connected to the semiconductor substrate 10. An electrode 15 is provided on the ground-isolating N well 13. As shown in FIG. 5, the electrode 15 and the first wire 11 are connected by lines 19 to a control power supply 3.

The bipolar transistor 17 used as a switching power transistor is provided in the second N well 9 which constitutes a part of the power portion. Also provided in the second N well 9 is the circuit (not shown) for driving the transistor 17, i.e., the switching power transistor.

The bipolar transistor 17 comprises an $N^+$-type collector region 17a, a P-type base region 17b and an $N^+$-type emitter region 17c. The emitter region 17c is provided in the base region 17b. A collector electrode C2 is provided on the collector region 17, a base electrode B2 on the base region 17b, and an emitter electrode E2 on the emitter region 17c.

As illustrated in FIG. 4, a second wire 11 is provided on the insulating film 20, surrounding the second N well 8. The second wire 12 has a part extending across the first N well 9. This part of the second wire 12 is electrically connected to the emitter electrode E2 of the bipolar transistor 17.

The insulating film 20 has an opening 21 near the N well 13 which is provided for isolating grounds. A part of the second wire 12 is provided in the opening 21 and is therefore electrically connected to the semiconductor substrate 10.

The first wire 11 connected to the S-GND of the small-signal portion and partly provided in the opening 18 of the insulating film 20 is connected by the semiconductor substrate 10 to the second wire 12 connected to the P-GND of the power portion and partly provided in the opening 21 of the insulating film 20. Hence, both the S-GND and the P-GND are connected to the semiconductor substrate 10. This prevents a current from flowing in the substrate 10 while the integrated circuit is operating. Hence, no parasitic transistor operates to cause the semiconductor device to malfunction.

The ground-isolating N well 13 is provided between the S-GND and the P-GND, or between the first N well 8 and the second N well 9, and has the electrode 15 which can be connected to an external component. Thus, the P-type semiconductor substrate 10 and the N well 13 constitute a P-channel, junction field-effect transistor (hereinafter referred to as "PchJFET").

The first wire 11 and the second wire 12 serve as the source and drain of the PchJFET, or vice versa. The electrode 15 on the N well 13 serves as the gate of the PchJFET. The on-resistance of the PchJFET is at its minimum value when the gate voltage is equal to the source voltage. As the gate gate voltage rises over the source voltage, the on-resistance increases until the PchJFET becomes non-conducting. When the gate voltage is lower than the source voltage and the drain voltage, the source, drain and gate form a diode. In this case, the gate voltage must always be equal to or higher than the source voltage and the drain voltage.

Figure 6:
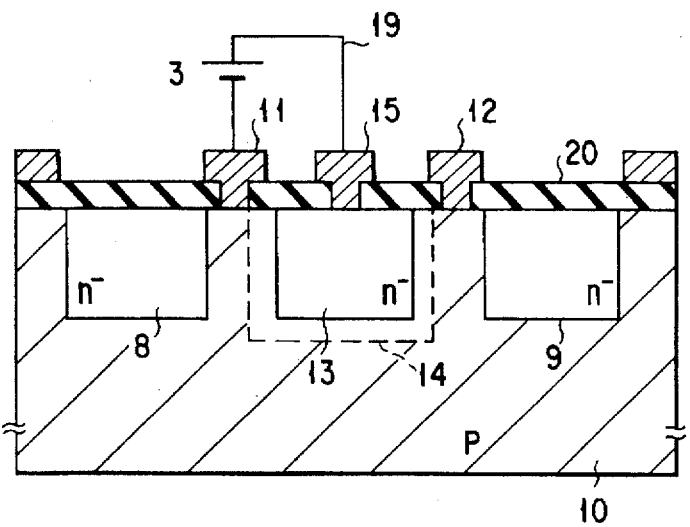
FIG. 6 is a sectional view of the device shown in FIG. 4, explaining how a depletion layer is formed to surround the ground-isolating N well, when a reverse bias is applied to the electrode provided on the N well.

When a reverse bias is applied between the electrode 15 and the first wire 11 from the control power supply 3 through the lines 19, a depletion layer 14 is formed, which surround the ground-isolating N well 13 as shown in FIG. 6. It is therefore possible to increase the resistance between the first wire 11 and the second wire 12 or to pinch off the PchJFET.

As a result, the S-GND region of the small-signal portion and the P-GND region of the power portion, both provided in the semiconductor substrate 10 can be isolated sufficiently. Therefore, no interference occurs between the S-GND and the P-GND. This prevents the semiconductor device from malfunction.

The N well 13 provided between the first N well 8 and the second N well 9 in order to isolating the grounds can be replaced by a dummy well which can isolate the grounds. The depletion layer 14 can have any desired size, merely by setting the reverse bias and the impurity concentrations of the substrate 10 and N well regions 8 and 9 at appropriate values.

The electrode 15 provided on the N well 13 may be used as the gate of the PchJFET. If the electrode 15 is so used, the N well 13 can be used as a resistor or as a part of a transistor.

Figure 2:
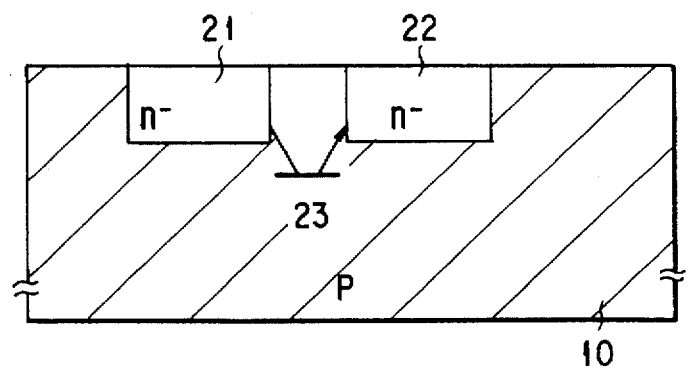
FIG. 2 is a sectional view of a conventional semiconductor device in which a parasitic NPN transistor is formed in a region between two element regions provided in the semiconductor substrate.
Figure 3:
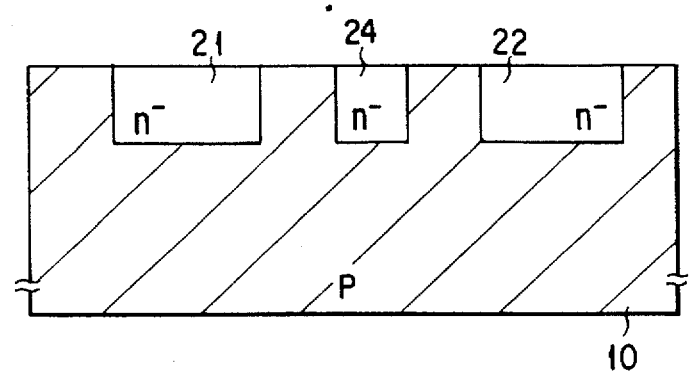
FIG. 3 is a sectional view of a conventional semiconductor device in which a dummy N well is provided between two element regions provided in the semiconductor substrate, for preventing the formation of a parasitic NPN transistor of the type shown in FIG. 2.

In the conventional semiconductor device (FIG. 3), the dummy N well 24 located between the wells 21 and 22 is the N-type diffusion region provided in the base region of an NPN transistor formed in the P-type semiconductor substrate 10. So located, the dummy N well 24 prevents the NPN transistor 23 (FIG. 2) from operating as a parasitic transistor.

In the semiconductor device according to the invention, the N well 13 constitutes a PchJFET, jointly with the P-type semiconductor substrate 10. The electrode 15 functions as the gate electrode of the PchJFET. The PchJFET can be made non-conducting by controlling the gate voltage of the transistor. Ultimately, the N well 13 isolates the the S-GND and the P-GND, both connected to the P-type semiconductor substrate 10. The device of this invention differs in structure and operation from the conventional semiconductor device illustrated in FIG. 3.

Figure 7:
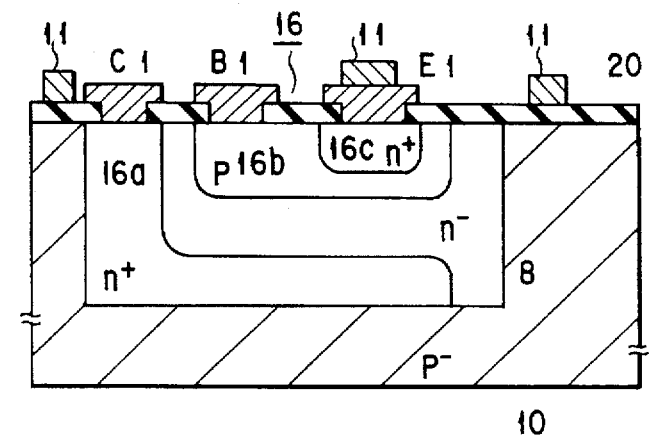
FIG. 7 is a sectional view of the semiconductor device, taken along line VII—VII in FIG. 4.

FIG. 7 is a sectional view of the device, taken along line VII—VII in FIG. 4. As shown in FIG. 7 and as described above, the bipolar transistor 16, which constitutes a part of the small-signal portion, comprises an $N^+$-type collector region 16a, a P-type base region 16b and an $N^+$-type emitter region 16c. The emitter region 16c is provided in the base region 16b. A collector electrode C1 is provided on the collector region 16a, a base electrode B1 on the base region 16b, and an emitter electrode E1 on the emitter region 16c.

As illustrated in FIG. 4, the first wire 11 connected the small-signal portion including the N well 8 is provided on the insulating film 20, surrounding the first N well 8. The first wire 11 is electrically connected to the emitter electrode E1 of the bipolar transistor 16. This structure has been described above, with reference to FIG. 4.

A semiconductor device according to a second embodiment of the invention will be described, with reference to FIG. 8.

The second embodiment is characterized in that the potential of the ground-isolating N well 13 is used as the reference voltage for the P-GND, whereas that potential is used as the reference voltage for the S-GND in the first embodiment illustrated in FIG. 5.

Figure 8:
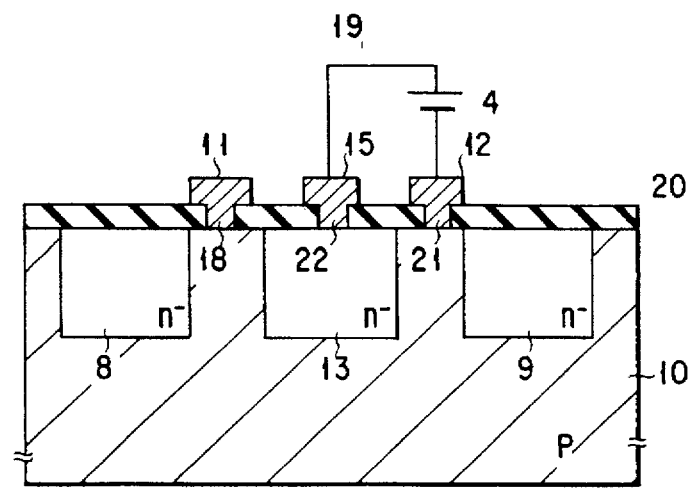
FIG. 8 is a sectional view of a semiconductor device according to a second embodiment of the invention, in which the ground-isolating N well has its potential set at a P-GND reference value.

As seen from FIG. 8, a first wire 11 is connected to the control ground (S-GND) of the first N well 8. The first wire 11 is made of, for example, an aluminum film. It is provided, in part, in a through hole 18 made in the insulating film 20 which is provided on a major surface of a semiconductor substrate 10. The first wire 11 is therefore connected to the semiconductor substrate 10.

A second wire 12 is connected to the power ground (P-GND) of the second N well 9. The second wire 12 is made of, for example, an aluminum film. It is provided, in part, in a through hole 21 made in the insulating film 20. The second wire 12 is connected to the semiconductor substrate 10 since the film 20 is provided on the major surface of the substrate 10.

The N wells 8 and 9 are located close to each other. Located between them is a ground-isolating N well 13 which is provided in the surface of the semiconductor substrate 10. Like the wells 8 and 9, the N well 13 has been formed by diffusing an impurity such as arsenic or phosphorus into a prescribed surface region of the substrate 10 by means of known semiconductor-manufacturing technique such as impurity diffusion or ion implantation.

An electrode 15 is provided on the insulating film 20. The electrode 15 is made of aluminum or aluminum alloy. It is provided, in part, in a through hole 22 made in the film 20 and is thus connected to the ground-isolating N well 13. The electrode 15 is connected by a line 19 to one end of a power supply (VDH) 4 for applying a reverse bias to the electrode 15. The other end of the power supply 4 is connected to the second wire 12.

The reverse bias can be applied to the electrode 15 from the first N well 8 by connecting the electrode 15 to the first wire 11 by the power supply 3, or from the second N well 9 by connecting the electrode 15 to the second wire 12 by the power supply 3.

A semiconductor device according to a third embodiment of the invention will be described, with reference to FIG. 9.

The third embodiment is characterized in that it comprises an N-type semiconductor substrate 30 and P wells 22 and 23, whereas the first embodiment (FIG. 6) comprises the P-type semiconductor substrate 10 and the N wells 8 and 9.

Figure 9:
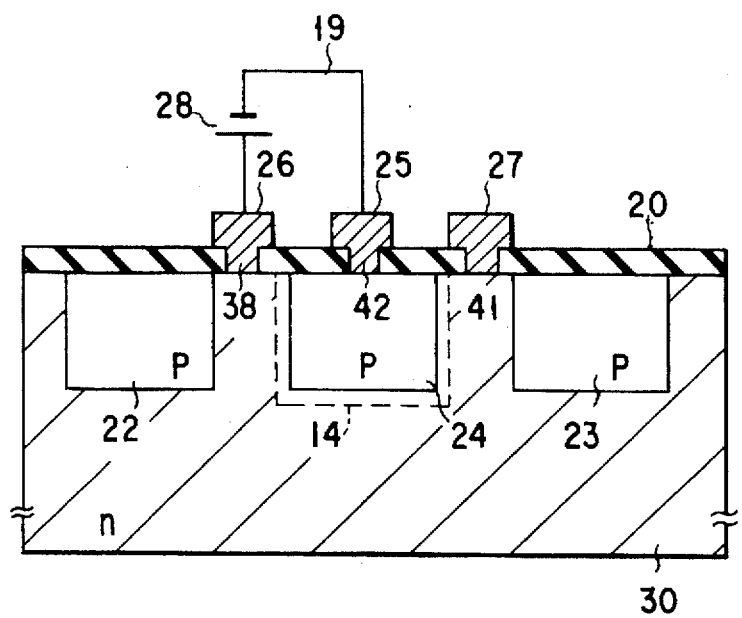
FIG. 9 is a sectional view of a semiconductor device according to a third embodiment of the present invention, which comprises an N-type semiconductor substrate and element regions each composed of a P-type well.

As shown in FIG. 9, both P well 22 and 23 are provided in one major surface of the N-type semiconductor substrate 10. The first P well 22 is a part of a small-signal portion, and the second P well 23 is a part of a power portion. The surface of the N-type semiconductor substrate 30 is covered with an insulating film 20 made of, for example, $SiO_2$.

The P wells 22 and 23 are located close to each other. Located between them is a ground-isolating P well 24 which is provided in the surface of the semiconductor substrate 30. Like the wells 22 and 23, the P well 24 has been formed by diffusing an impurity such as arsenic or phosphorus into a prescribed surface region of the substrate 10 by means of known semiconductor-manufacturing technique such as impurity diffusion or ion implantation.

An electrode 25 is provided on the insulating film 20. The electrode 25 is made of aluminum or aluminum alloy. It is provided, in part, in a through hole 42 made in the film 20 and is thus connected to the ground-isolating P well 24. The electrode 25 is connected by a line 19 to one end of a control power supply (VDL) 28 for applying a reverse bias to the electrode 25. The other end of the power supply 28 is connected to the first wire 26.

When the reverse bias can be applied to the electrode 25, a depletion layer 14 is formed in the ground-isolating P well 24, efficiently isolating the the S-GND and the P-GND. Hence, no interference occurs between the S-GND and the P-GND.

As can be understood from the above, the present invention can be applied, regardless of the conductivity type of the semiconductor substrate used.

Various shapes and positions which the ground-isolating well can take in the present invention will be described, with reference to FIGS. 10, 11 and 12.

Figure 10:
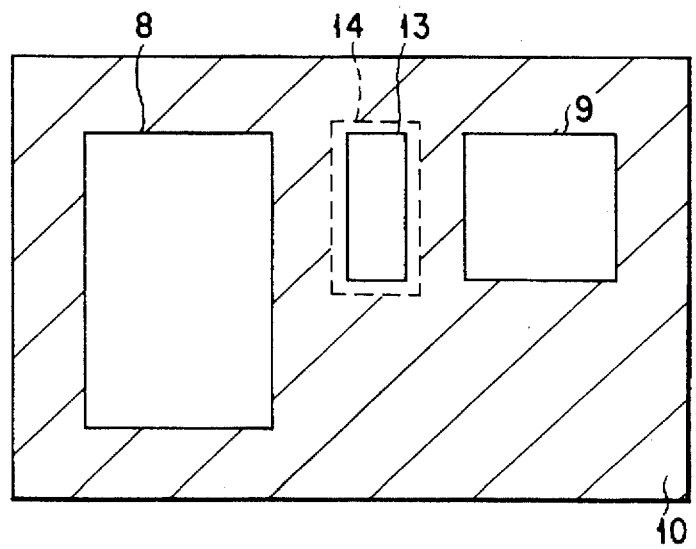
FIG. 10 is a plan view of a semiconductor device according to this invention, illustrating the position and shape of the ground-isolating well.

FIG. 10 illustrates a ground-isolating well of a specifies shape, arranged at a specific position.

As shown in FIG. 10, this device comprises a P-type semiconductor substrate 10, a first N well 8, a second N well 9 and a ground-isolating N well 13. The N wells 8 and 9 are element regions. More correctly, they are a part of a small-signal portion and a part of a power region, respectively, both included in a chip provided on the semiconductor substrate 10. The N wells 8 and 9, each having a desired shaped, are located at the positions shown in FIG. 10, close to each other. The ground-isolating N well 13 is arranged between the first N well 8 and the second N well 9. The N well 13 prevents the grounds of the N wells 8 and 9 from interfering. Therefore, the semiconductor device operates, without making errors.

The N well 13 can be arranged at any position, as long as it prevents interference between the grounds, thus not causing the device to malfunction. Usually it is desirable that the ground-isolating N well be is located at any position between the element regions 8 and 9 which are positioned close to each other.

As shown in FIG. 10, the first N well 8 and the second N well 9 oppose each other, across the ground-isolating N well 13. The first N well 8 constitute a part of the small-signal portion including a signal control circuit. The second N well 9 constitutes a part of the power portion which includes a power transistor and a circuit for driving the power transistor oppose each other.

The second N well 9 is smaller area than the first N well 8. The ground-isolating N well 13 has the size as the second N well 9. A depletion layer is formed around the N well 13 as shown in FIG. 10, when a reverse bias is applied to the N well well 13.

FIG. 11 illustrates a ground-isolating well having another shape and arranged at another specific position in a semiconductor device.

This semiconductor device comprises a first N well 8, a second N well 9 and the ground-isolating N well 13, too. The N wells 8 and 9 oppose each other. The second N well 9 is larger than the first N well 8. The ground-isolating N well 13 is provided between the first N wells 8 and the second N well 9. The N well 13 is L-Shaped, surrounding two neighboring sides of the first N well 8. Thus, the N well 13 reliably isolates the first N well 8 from the second N well 9. When a reverse bias is applied to the N well 13, a depletion layer 14 is formed, which surrounds the ground-isolating N well 13.

FIG. 12 shows a ground-isolating well having still another shape and arranged at still another specific position in a semiconductor device.

The device comprises a first N well 8, a second N well 9 and a ground-isolating N well 13, too. The N wells 8 and 9 opposes each other. The ground-isolating N well 13 is shaped like a frame, surrounding the four sides of the second N well 9. Surrounding the second N well 9, the N well 13 reliably isolates the second N well 9 from the first N well 8.

According to the present invention, an element such as a bipolar transistor, a MOS transistor, a CMOS element or a BiCMOS element is provided in the small-signal portion S in which the first N or P well is formed. Provided in the power portion is a switching element such as a power MOSFET, an IGBT or power bipolar transistor, or an element such as bipolar transistor, a MOS transistor, a CMOS element or a BiCMOS element. The ground-isolating well 13 is formed at the same time a plurality of well regions are formed in the surface of the semiconductor substrate. Namely, the well 13 is formed without increasing the number of steps of manufacturing the semiconductor device. In view of this, it is desirable that the ground-isolating well 13 have the same depth as the other well regions.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device having the grounds of element regions are provided in a semiconductor substrate, comprising:

a semiconductor substrate of a first conductivity type;

at least two element regions of a second conductivity type, provided in said semiconductor substrate and having grounds connected to said semiconductor substrate when said semiconductor substrate is set at a fixed potential; and at least one ground-isolating well region of the second conductivity type, provided between said at least two element regions to electrically isolate said at least two element regions by forming a depletion layer between said at least two element regions when applied with a reverse bias voltage.

2. The device according to claim 1, wherein said at least one ground-isolating well region receives a reverse bias from a power supply connected between at least one ground-isolating well regions and one of said at least two adjacent element regions.

3. The device according to claim 1, wherein said at least one ground-isolating well region is a dummy well.

4. The device according to claim 1, wherein said at least one ground-isolating well region is an N-type well, said semiconductor substrate is a P-type substrate, and a P-channel, junction field-effect transistor is provided which comprises said semiconductor substrate and said at least one ground-isolating region.

5. The device according to claim 1, wherein said at least one ground-isolating well region is arranged between said at least two element regions which are more closer to each other than to any other element region.

6. The device according to claim 1, wherein said at least one ground-isolating well region is arranged, surrounding and spaced apart from a part of one of said at least two element regions which are more closer to each other than to any other element region.

* * * * *